US009136130B1

(12) United States Patent
Wada et al.

(10) Patent No.: US 9,136,130 B1
(45) Date of Patent: Sep. 15, 2015

(54) THREE DIMENSIONAL NAND STRING WITH DISCRETE CHARGE TRAP SEGMENTS

(71) Applicant: SanDisk Technologies, Inc., Plano, TX (US)

(72) Inventors: Takayuki Wada, Yokkaichi (JP); Shigehiro Fujino, Yokkaichi (JP)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/456,515

(22) Filed: Aug. 11, 2014

(51) Int. Cl.
*H01L 21/336* (2006.01)
*H01L 21/28* (2006.01)
*H01L 27/115* (2006.01)

(52) U.S. Cl.
CPC ...... *H01L 21/28273* (2013.01); *H01L 27/1157* (2013.01); *H01L 27/11524* (2013.01); *H01L 27/11556* (2013.01); *H01L 27/11582* (2013.01)

(58) Field of Classification Search
CPC .............. H01L 27/11582; H01L 29/7926; H01L 27/11556; H01L 27/11578; H01L 29/66833; H01L 29/792; H01L 27/1157; H01L 29/7889; H01L 27/11551; H01L 21/28282; H01L 2924/0002; H01L 29/66825; H01L 2924/00
USPC .............. 257/324, 326, 319, E29.3, E21.422, 257/E21.68; 438/266, 268
See application file for complete search history.

(56) References Cited

U.S. PATENT DOCUMENTS

| 5,084,417 A | 1/1992 | Joshi et al. |
| 5,807,788 A | 9/1998 | Brodsky et al. |
| 5,915,167 A | 6/1999 | Leedy |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,378,353 B2 | 5/2008 | Lee et al. |
| 7,514,321 B2 | 4/2009 | Mokhlesi et al. |
| 7,575,973 B2 | 8/2009 | Mokhlesi et al. |
| 7,608,195 B2 | 10/2009 | Wilson |

(Continued)

FOREIGN PATENT DOCUMENTS

WO WO 02/15277 A2 2/2002

OTHER PUBLICATIONS

Kanakamedala, S.K. et al., "Methods of Making Three Dimensional Nand Devices," U.S. Appl. No. 14/319,283, filed Jun. 30, 2014.

(Continued)

*Primary Examiner* — Mark A Laurenzi
(74) *Attorney, Agent, or Firm* — The Marbury Law Group PLLC

(57) ABSTRACT

A method of making a monolithic three dimensional NAND string includes forming a stack of alternating layers of a first material and a second material different from the first material over a substrate, etching the stack to form at least one opening in the stack, forming a buffer layer over a sidewall of the at least one opening, forming a charge storage material layer over the buffer layer, forming a tunnel dielectric layer over the charge storage material layer in the at least one opening, and forming a semiconductor channel material over the tunnel dielectric layer in the at least one opening. The method also includes selectively removing the second material layers without removing the first material layers and etching the buffer layer using the first material layers as a mask to form a plurality of separate discrete buffer segments and to expose portions of the charge storage material layer.

22 Claims, 9 Drawing Sheets

(56) References Cited

U.S. PATENT DOCUMENTS

| | | | |
|---|---|---|---|
| 7,648,872 | B2 | 1/2010 | Benson |
| 7,745,265 | B2 | 6/2010 | Mokhlesi et al. |
| 7,745,312 | B2 | 6/2010 | Herner et al. |
| 7,808,038 | B2 | 10/2010 | Mokhlesi et al. |
| 7,848,145 | B2 | 12/2010 | Mokhlesi et al. |
| 7,851,851 | B2 | 12/2010 | Mokhlesi et al. |
| 8,008,710 | B2 | 8/2011 | Fukuzumi |
| 8,053,829 | B2 | 11/2011 | Kang et al. |
| 8,093,725 | B2 | 1/2012 | Wilson |
| 8,187,936 | B2 | 5/2012 | Alsmeier et al. |
| 8,193,054 | B2 | 6/2012 | Alsmeier |
| 8,198,672 | B2 | 6/2012 | Alsmeier |
| 8,283,228 | B2 | 10/2012 | Alsmeier |
| 8,349,681 | B2 | 1/2013 | Alsmeier et al. |
| 8,415,742 | B2 | 4/2013 | Kim et al. |
| 2006/0102586 | A1 | 5/2006 | Lee et al. |
| 2007/0210338 | A1 | 9/2007 | Orlowski |
| 2007/0252201 | A1 | 11/2007 | Kito et al. |
| 2010/0044778 | A1 | 2/2010 | Seol |
| 2010/0112769 | A1 | 5/2010 | Son et al. |
| 2010/0120214 | A1 | 5/2010 | Park et al. |
| 2010/0155810 | A1 | 6/2010 | Kim et al. |
| 2010/0155818 | A1 | 6/2010 | Cho |
| 2010/0181610 | A1 | 7/2010 | Kim et al. |
| 2010/0207195 | A1 | 8/2010 | Fukuzumi et al. |
| 2010/0320528 | A1 | 12/2010 | Jeong et al. |
| 2011/0076819 | A1 | 3/2011 | Kim et al. |
| 2011/0133606 | A1 | 6/2011 | Yoshida et al. |
| 2011/0266606 | A1 | 11/2011 | Park et al. |
| 2012/0001247 | A1 | 1/2012 | Alsmeier |
| 2012/0001249 | A1 | 1/2012 | Alsmeier |
| 2012/0256247 | A1 | 10/2012 | Alsmeier |
| 2013/0122712 | A1 | 5/2013 | Kim et al. |
| 2013/0224960 | A1 | 8/2013 | Payyapilly et al. |
| 2013/0248974 | A1 | 9/2013 | Alsmeier et al. |
| 2013/0264631 | A1 | 10/2013 | Alsmeier et al. |
| 2013/0313627 | A1 | 11/2013 | Lee et al. |
| 2014/0008714 | A1 | 1/2014 | Makala et al. |

OTHER PUBLICATIONS

Endoh, et al., "Novel Ultra High Density Memory with a Stacked-Surrounding Gate Transistor (S-SGT) Structured Cell," IEDM Proc. (2001) 33-36.

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).

Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.

Y.S. Kim et al., "Direct Copper Electroless Deposition on a Tungsten Barrier Layer for Ultralarge Scale Integration," Journal of the Electrochemical Society, vol. 152 (2) 2005.

Y. Au et al., "Filling Narrow Trenches by Iodine-Catalyzed CVD of Copper and Manganese on Manganese Nitride Barrier/Adhesion Layers," Journal of the Electrochemical Society, vol. 158 (5) 2011.

K. R. Williams et al., "Etch Rates for Micromachining Processing," Journal of Microelectromechanical Systems, vol. 5, No. 4, Dec. 1996.

K. R. Williams et al., "Etch Rates for Micromachining Processing Part II," Journal of the Microelectromechanical Systems, vol. 12, No. 6, Dec. 2003.

M. Claes et al., "Selective Wet Etching of Hf-based Layers," Abstracts, 204th Meeting of the Electrochemical Society, 2003.

U.S. Appl. No. 13/762,988, filed Feb. 8, 2013, SanDisk Technologies Inc.

U.S. Appl. No. 14/133,979, filed Dec. 19, 2013, SanDisk Technologies Inc.

U.S. Appl. No. 14/183,152, filed Feb. 18, 2014, SanDisk Technologies Inc.

U.S. Appl. No. 14/219,161, filed Mar. 19, 2014, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

U.S. Appl. No. 14/264,262, filed Apr. 29, 2014, SanDisk Technologies Inc.

U.S. Appl. No. 14/264,312, filed Apr. 29, 2014, SanDisk Technologies Inc.

U.S. Appl. No. 14/264,407, filed Apr. 29, 2014, SanDisk Technologies Inc.

U.S. Appl. No. 14/282,567, filed May 20, 2014, SanDisk Technologies Inc.

U.S. Appl. No. 14/319,283, filed Jun. 30, 2014, SanDisk Technologies Inc.

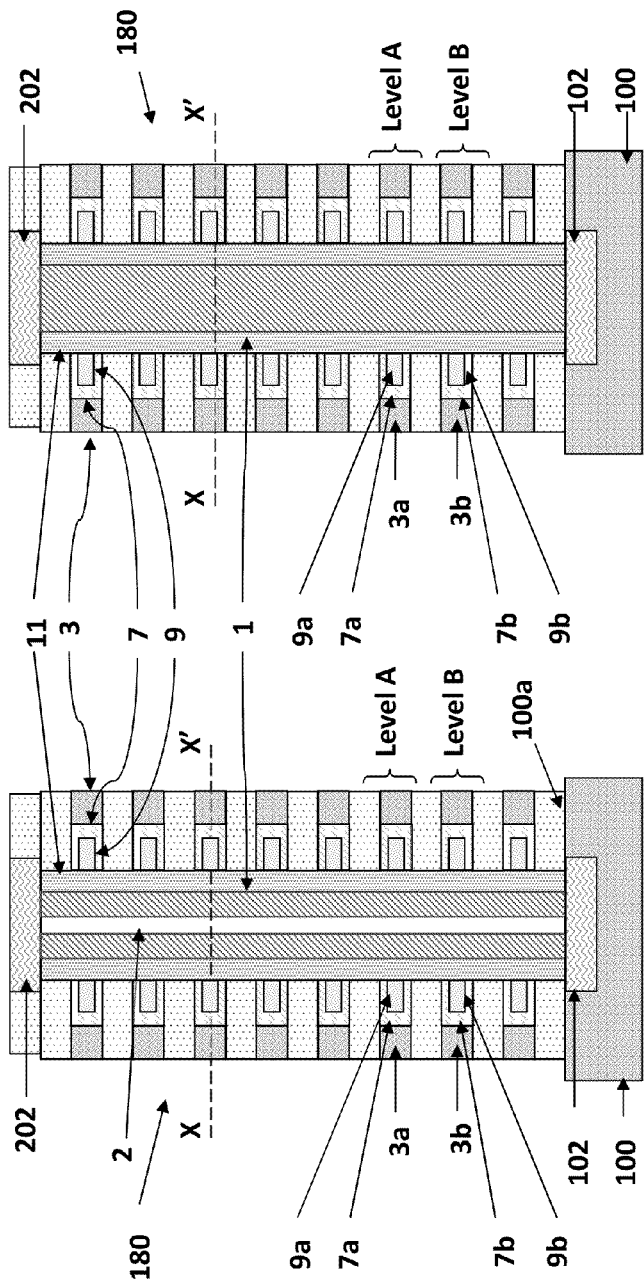

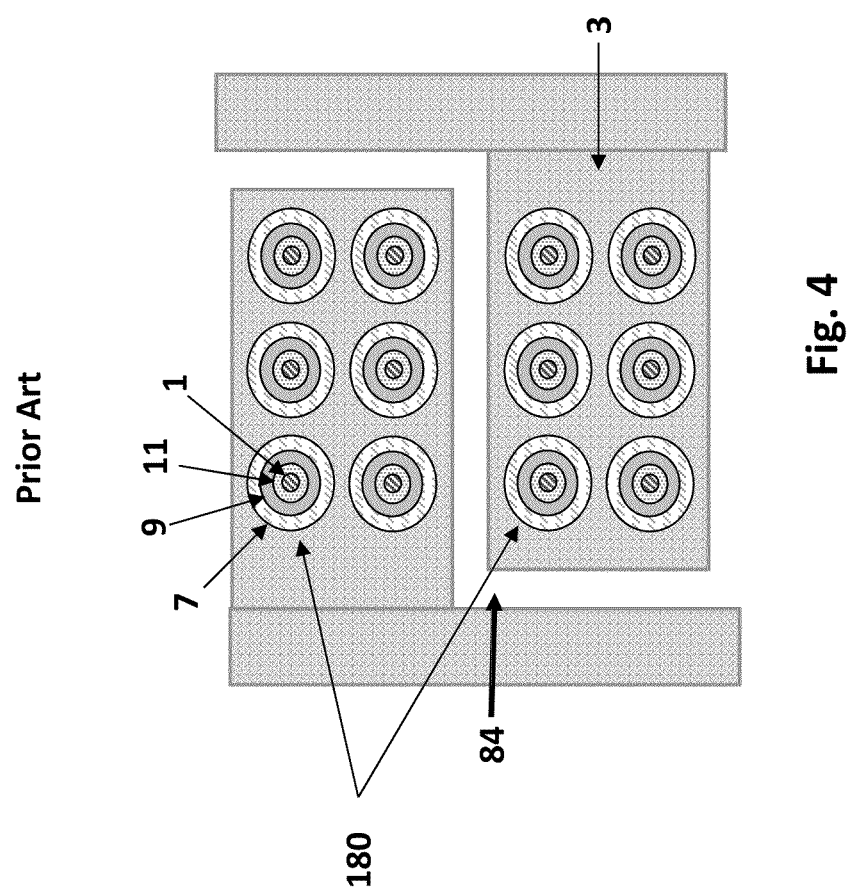

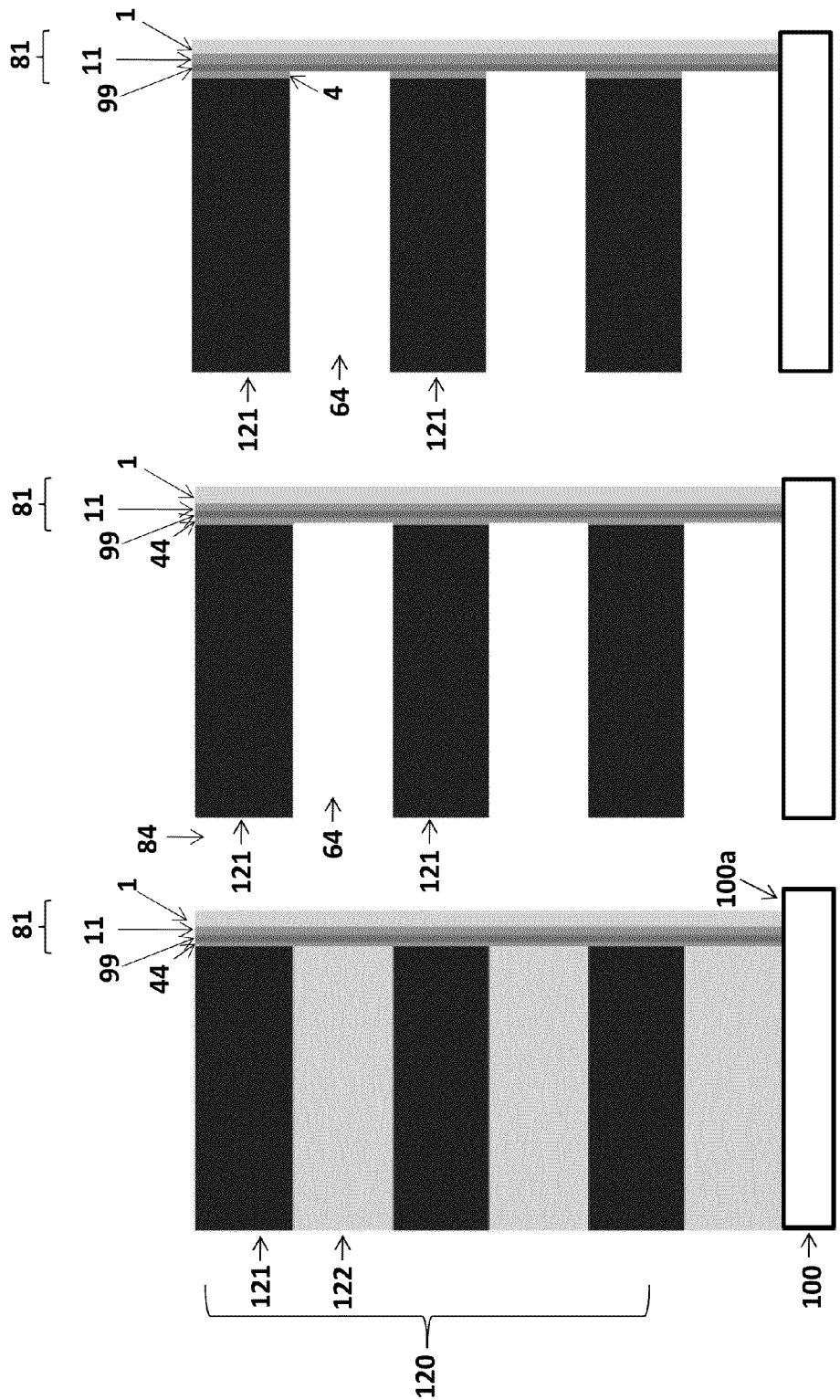

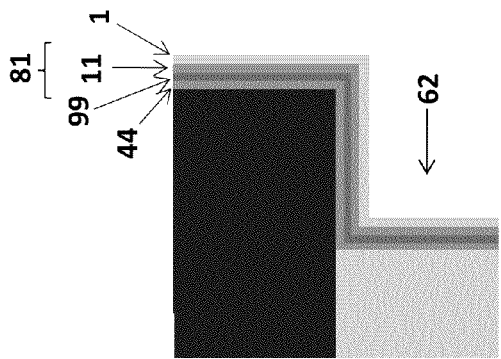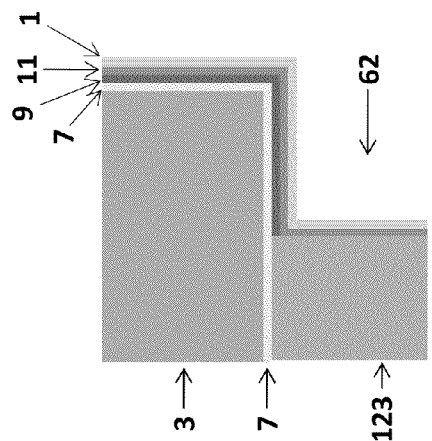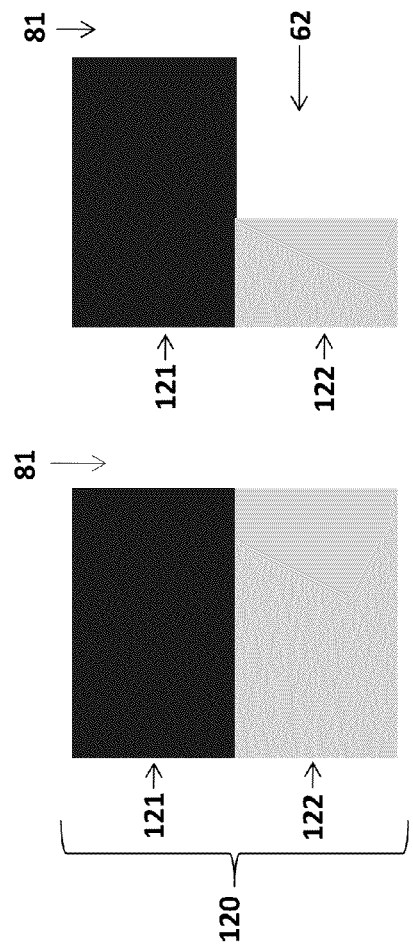

THREE DIMENSIONAL NAND STRING WITH DISCRETE CHARGE TRAP SEGMENTS

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a method of making a monolithic three dimensional NAND string including forming a stack of alternating layers of a first material and a second material different from the first material over a substrate, etching the stack to form at least one opening in the stack, forming a buffer layer over a sidewall of the at least one opening, forming a charge storage material layer over the buffer layer, forming a tunnel dielectric layer over the charge storage material layer in the at least one opening, and forming a semiconductor channel material over the tunnel dielectric layer in the at least one opening. The method also includes selectively removing the second material layers without removing the first material layers, etching the buffer layer using the first material layers as a mask to form a plurality of separate discrete buffer segments and to expose portions of the charge storage material layer and etching the exposed portions of the charge storage material layer using the first material layers as a mask to form a plurality of separate discrete charge storage segments. The method also includes depositing an insulating material between the first material layers to form alternating layers of insulating material layers and the first material layers, selectively removing the first material layers to expose a sidewall of the discrete buffer segments, etching the discrete buffer segments to expose a sidewall of the discrete charge storage segments, forming a blocking dielectric over the sidewall of the discrete charge storage segments exposed between the insulating material layers and forming control gate electrodes over the blocking dielectric between the insulating material layers.

Another embodiment relates to a method of making a monolithic three dimensional NAND string including forming a stack of alternating layers of a first material and a second material different from the first material over a substrate, etching the stack to form at least one opening in the stack and selectively removing a portion of the second material layers without removing the first material layers to form first recesses between the first material layers. The method also includes forming a charge storage material layer over a sidewall of the at least one opening and over exposed surface of the layers of first material and remaining second material in the first recesses, forming a tunnel dielectric layer over the charge storage material layer in the at least one opening and in the first recesses and forming a semiconductor channel material over the tunnel dielectric layer in the at least one opening and in the first recesses. The method also includes selectively removing the remaining second material layers without removing the first material layers, etching the charge storage material layer using the first material layers as a mask to form a plurality of separate discrete charge storage segments and depositing an insulating material between the first material layers to form alternating layers of insulating material layers and the first material layers. The method also includes selectively removing the first material layers to expose a sidewall of the discrete charge storage segments, forming a blocking dielectric over the sidewall of the discrete charge storage segments exposed between the insulating material layers and forming control gate electrodes over the blocking dielectric between the insulating material layers.

BRIEF DESCRIPTION OF THE DRAWINGS

FIGS. 1A and 1B are respectively side cross sectional and top cross sectional views of a conventional NAND string. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of another conventional NAND string. FIG. 2A is a side cross sectional view of the device along line Y-Y' in FIG. 2B, while FIG. 2B is a side cross sectional view of the device along line X-X' in FIG. 2A.

FIG. 4 is a top schematic view of a portion of a conventional memory device comprising NAND strings.

FIGS. 5A-5I illustrate a method of making a NAND string according to an embodiment.

FIGS. 6A-6D illustrate steps in a method of making a NAND string according to another embodiment.

DETAILED DESCRIPTION

Many conventional three dimensional NAND memories store charge in silicon nitride charge storage dielectric layers. The conventional devices have a continuous charge trap layer inside the memory hole. Charge accumulated in the charge trap layer may migrate to adjacent memory cells. This migration results in the degradation of data retention.

The inventors have realized that the data retention can be improved by fabricating a charge trap structure that comprises discrete charge trap segments rather than a continuous layer. That is, the charge trap layer is divided into separate charge storage segments with a discrete charge storage segment in each device level.

Embodiments of the invention, described in more details below, include methods of making three dimensional NAND strings with discrete charge trapping segments. In an embodiment, the method includes forming a sacrificial blocking layer in the memory hole. The sacrificial blocking layer may comprise any suitable material such as silicon oxide or aluminum oxide. In another embodiment, the method includes the formation of a buffer layer in the memory hole. The buffer layer may comprise any suitable material such as polysilicon.

In still another embodiment, the method includes the formation of a front side recess in a sacrificial layer during fabrication of the NAND string. Other embodiments include combinations of sacrificial blocking layer, buffer layer and/or the front side recess in the sacrificial layer.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
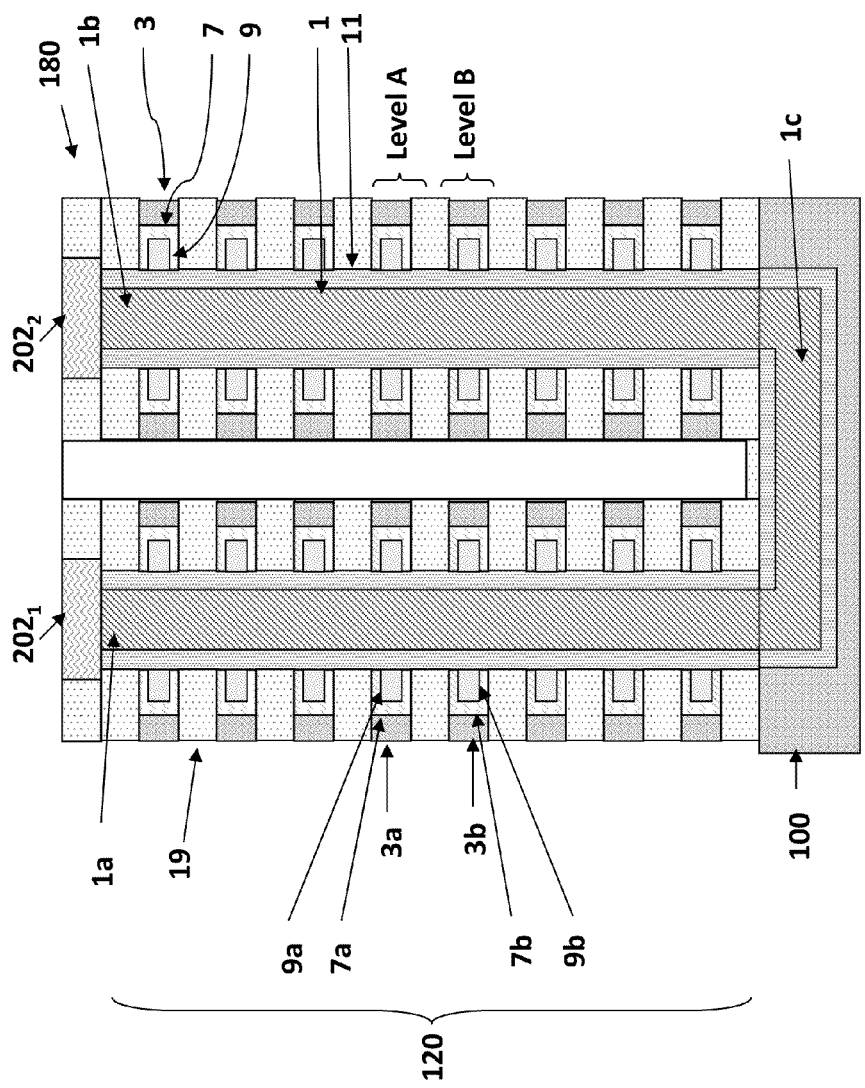
FIG. 3A is a side cross sectional view of a conventional NAND string of an embodiment with a U-shaped channel.
Figure 3B:
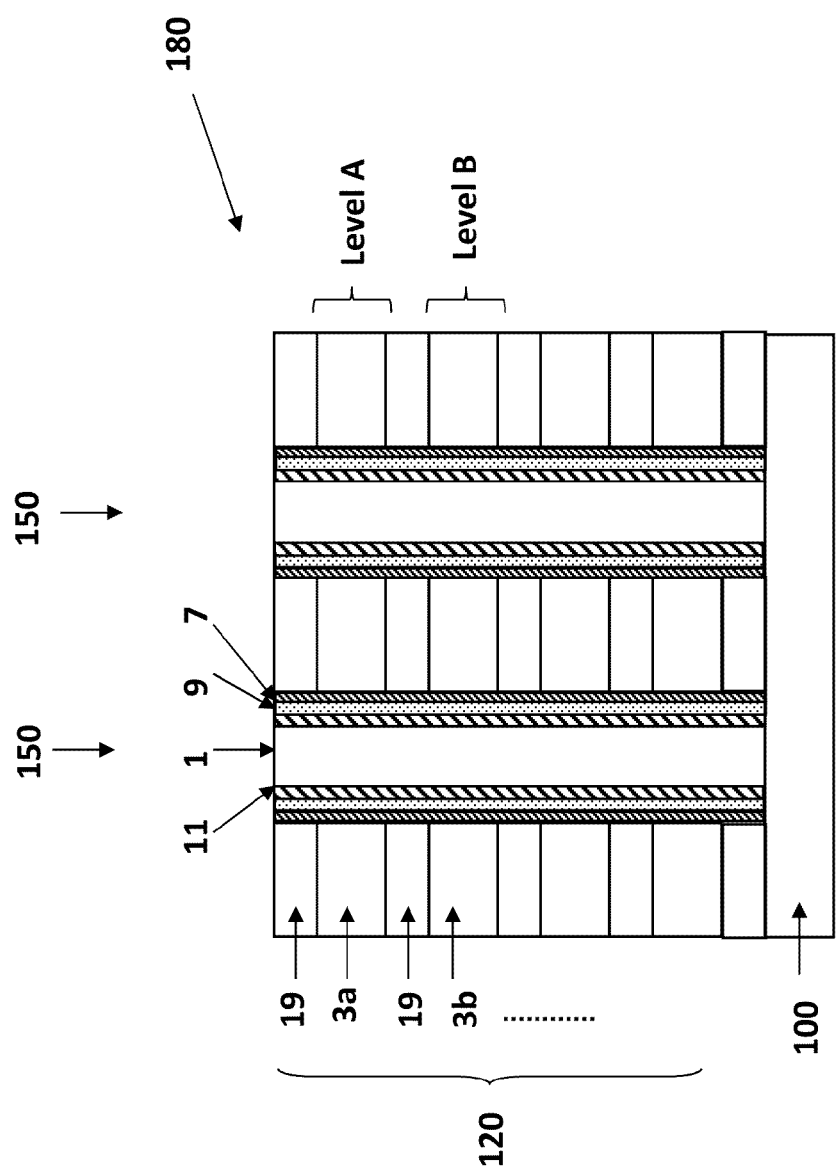
FIG. 3B is a side cross sectional view of another conventional NAND string.

In some embodiments, the monolithic three dimensional NAND string 180 comprises a semiconductor channel 1 having at least one end portion extending substantially perpendicular to a major surface 100a of a substrate 100, as shown in FIGS. 1A, 2A and 3B. "Substantially perpendicular to" (or "substantially parallel to") means within 0-10°. For example, the semiconductor channel 1 may have a pillar shape and the entire pillar-shaped semiconductor channel extends substantially perpendicularly to the major surface of the substrate 100, as shown in FIGS. 1A, 2A and 3B. In these embodiments, the source/drain electrodes of the device can include a lower electrode 102 provided below the semiconductor channel 1 and an upper electrode 202 formed over the semiconductor channel 1, as shown in FIGS. 1A and 2A.

Alternatively, the semiconductor channel 1 may have a U-shaped pipe shape, as shown in FIG. 3A. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1-3B for clarity.

In some embodiments, the semiconductor channel 1 may be a filled feature, as shown in FIGS. 2A, 2B, 3A and 3B. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3A and/or the channel 1 shown in FIG. 3B may alternatively be a hollow cylinder filled with an insulating fill material 2, shown in FIGS. 1A-1B.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B, 3A and 3B electrically separated from each other by a plurality of electrically insulating layers 19 forming a stack 120 of alternating control gate electrodes 3 and insulating layers 19. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof. For example, the control gate material in FIGS. 1A, 2A and 3A may comprise a conductive metal or metal alloy, such as tungsten and/or titanium nitride, while the control gate material in FIG. 3B may comprise doped polysilicon.

A blocking dielectric 7 is located adjacent to the control gate(s) 3 and may surround the control gate 3, as shown in FIGS. 1A, 2A and 3A. Alternatively, a straight blocking dielectric layer 7 may be located only adjacent to an edge (i.e., minor surface) of each control gate 3, as shown in FIG. 3B. The blocking dielectric 7 may comprise a layer having plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIG. 3A. Alternatively, the blocking dielectric 7 may be a straight, continuous layer, as shown in FIG. 3B, similar to the device described in U.S. Pat. No. 8,349,681 issued on Jan. 8, 2013 and incorporated herein by reference in its entirety.

The monolithic three dimensional NAND string also comprises a charge storage region 9. The charge storage region 9 may comprise one or more continuous layers which extend the entire length of the memory cell portion of the NAND string, as shown in FIG. 3B. For example, the charge storage region 9 may comprise an insulating charge trapping material, such as a silicon nitride layer.

Alternatively, the charge storage region may comprise a plurality of discrete charge storage regions 9, as shown in FIGS. 1A, 2A and 3A. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers).

FIG. 4 is a top schematic view illustrating a portion of a conventional memory device comprising NAND strings 180 having channels 1 located in respective memory holes 81 (e.g., front side openings). In this device, the memory holes 81 are circular, thereby resulting in cylindrical pillar shaped NAND strings 180. From the top view, the tunnel dielectric 11, charge storage region 9 and blocking dielectric form concentric rings around the channel 1. The control gate 3 in each device level is generally slab shaped. A back side opening 84, such as a trench, electrically separates adjacent control gates 3 and NAND strings 180 from each other. As discussed in more detail below, the back side opening 84 may be used in the manufacture of NAND strings 180 according to some embodiments.

Figure 5F:
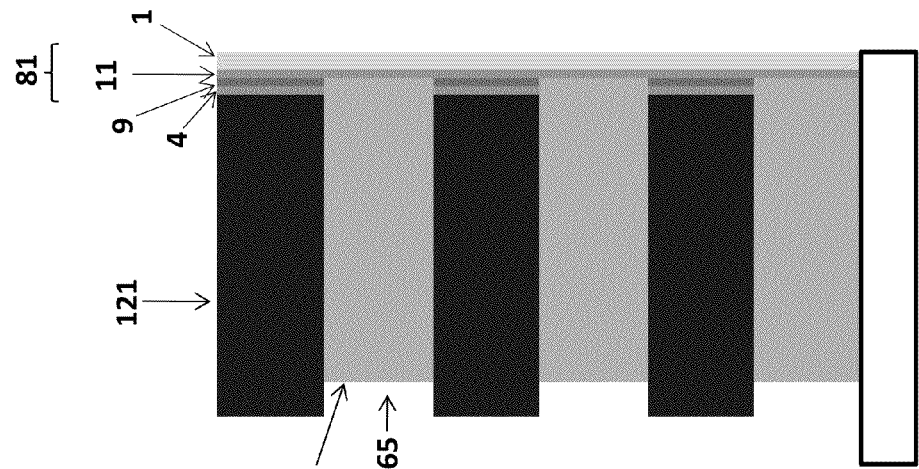

A first embodiment of making a NAND string 180 is illustrated in FIGS. 5A-5I. As illustrated in FIG. 5A, the method includes forming a stack 120 of alternating first material layers 121 and second material layers 122 over a major surface 100a of substrate 100. The stack 120 may be formed directly on the substrate 100 surface 100a. Alternatively, there may be intervening layers or devices located between the substrate 100 surface 100a and the stack 120. The second material is different from the first material. In an embodiment, the first material comprises a nitride, such as silicon nitride, and the second material comprises an oxide, such as silicon oxide, or polysilicon. Then, the stack 120 is etched to form at least one front side opening (memory hole) 81 in the stack 120.

Next, a sacrificial blocking layer 44 such as silicon oxide or another suitable etch stop material, such as polysilicon, is formed over a sidewall of the at least one front side opening 81. A charge storage material layer 99 may then be formed over the sacrificial blocking layer 44. Layer 99 comprises a different material from layer 44 such that layer 44 may be selectively etched using layer 99 as an etch stop. In an embodiment, the charge storage material layer 99 comprises a charge storage dielectric material, such as silicon nitride. In another embodiment, the charge storage material layer 99 comprises a floating gate material, such as metal or polysilicon. A tunnel dielectric layer 11 is formed over the charge storage material layer 99 followed by forming a semiconductor channel 1 material over the tunnel dielectric layer 11 in the at least one front side opening 81. In an embodiment, the step of forming the semiconductor channel 1 in the front side opening 81 completely fills the front side opening 81 with a semiconductor channel material. In an alternative embodiment, the step of forming the semiconductor channel 1 in the at least one front side opening 81 forms a semiconductor channel material over the sidewall of the at least one front side opening 81 but not in a central part of the at least one front opening 81 such that the semiconductor channel material does not completely fill the at least one front side opening 81. In this embodiment, similar to the NAND string illustrated in FIGS. 1A and 1B, the method further includes forming an insulating fill material 2 in the central part of the at least one front side opening 81 to completely fill the at least one front side opening 81.

Next, as illustrated in FIG. 5B, the method includes forming a back side opening 84, such as the trench shown in FIG. 4, and selectively removing the second material layers 122 through the back side opening 84 in the stack 120 without removing the first material layers 121. The second material layers 122 may be selectively removed by selective etching. The second material layers 122 may be selectively wet etched with an aqueous HF solution if the second material layers 122 comprise silicon oxide and blocking layer 44 comprises polysilicon and the sacrificial blocking layer 44 comprises silicon oxide. The second material layers 122 may be selectively wet etched with a tetramethylammonium hydroxide (TMAH) solution or a solution containing trimethyl-2 hydroxyethyl ammonium hydroxide (TMY) if the second material layers 122 comprise polysilicon and the sacrificial blocking layer 44 comprises silicon oxide. This etching step results in the formation of back side recesses 64 located between adjacent first material layers 121 such that the blocking layer 44 acts as an etch stop. Additionally, this step results in the sacrificial blocking layer 44 being exposed in the back side recesses 64.

Then, as illustrated in FIG. 5C, the exposed portions of the sacrificial blocking layer 44 in the back side recesses 64 are selectively etched, thereby exposing portions of the charge storage material layer 99. For example, if the blocking layer 44 comprises $SiO_2$, then HF may be used to selectively etch the blocking layer 44. If the blocking layer 44 comprises polysilicon, then TMY to TMAH may be used to selectively etch the blocking layer 44. This etching step separates the blocking layer 44 into discrete segments or portions 4 located between layers 121 and 99. Then, portions of the charge storage material layer 99 exposed in the recesses 64 are selectively etched using the first material layers 121 as a mask to form a plurality of separate discrete charge storage segments 9, as illustrated in FIG. 5D. For example, if the charge storage material layer 99 comprises $Si_3N_4$, then hot $H_3PO_4$ may be used to selectively etch charge storage material layer 99.

Figure 5E:
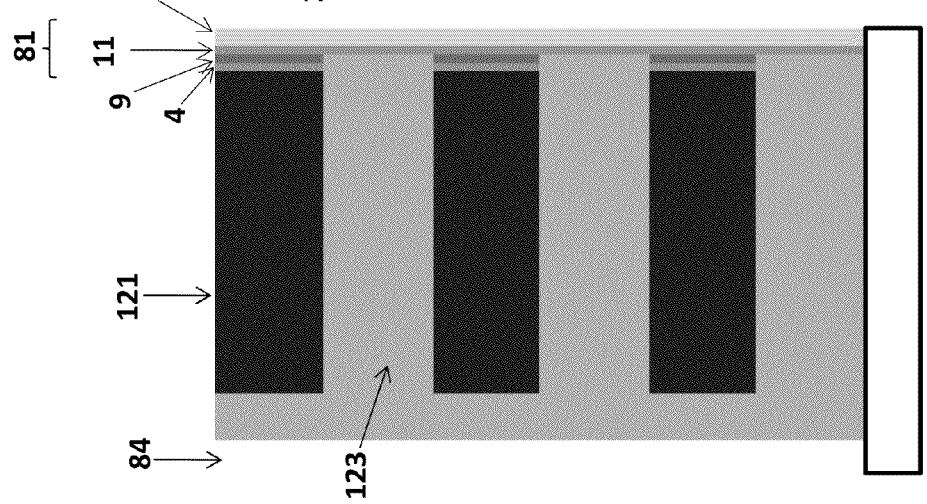
Figure 5D:
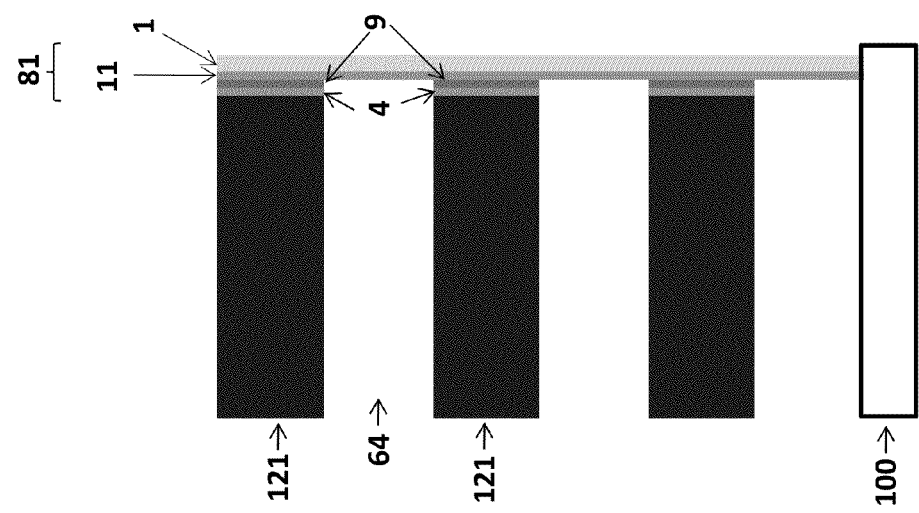

Next, the method includes depositing an insulating material in the back side opening 84 and between the first material layers 121 to form alternating layers of insulating material layers 123 and the first material layers 121, as illustrated in FIG. 5E. Layers 123 may comprise any insulating material which is different from the material of layers 121. Then, the method includes a step of removing the insulating material 123 from the back side opening 84 and optionally partially removing the insulating material 123 between the first material layers 121 to form second back side recesses 65 between adjacent first material layers 121, as illustrated in FIG. 5F.

Figure 5I:
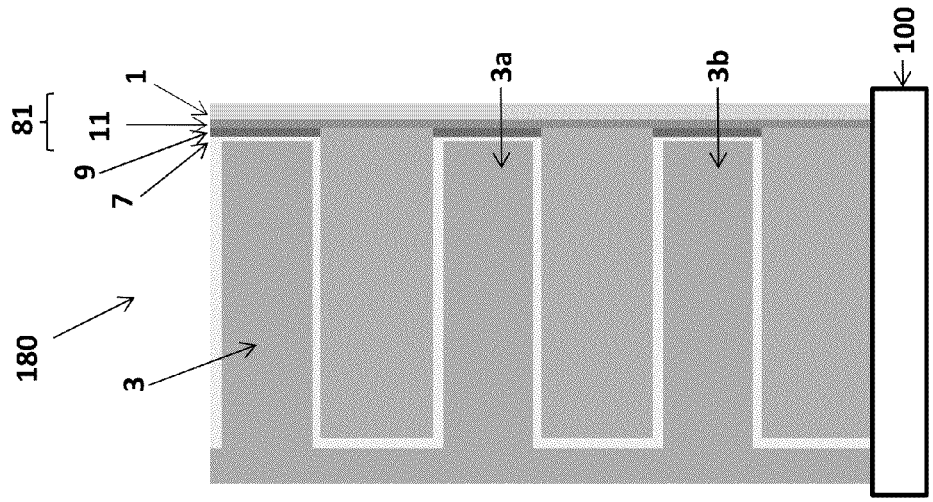
Figure 5H:
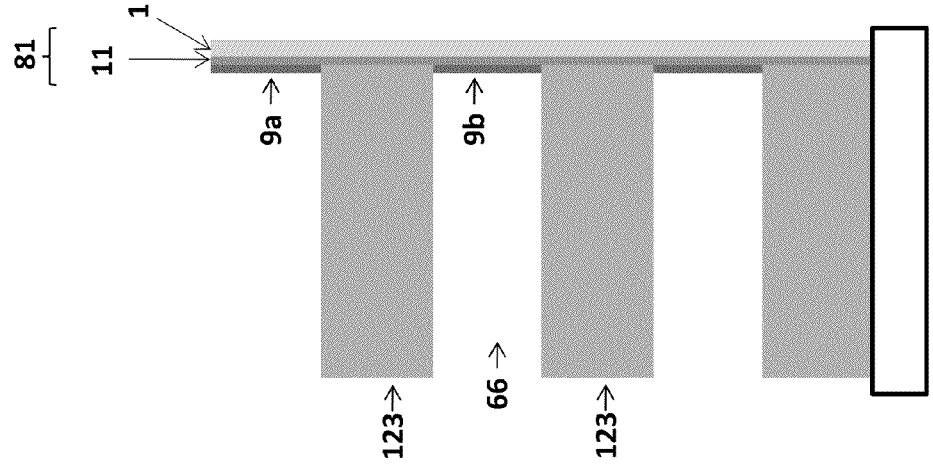
Figure 5G:
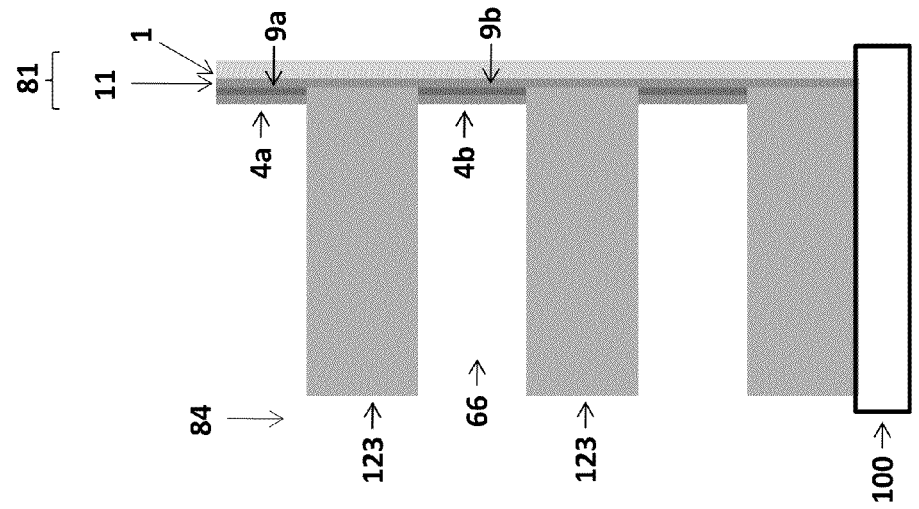

Next, as illustrated in FIG. 5G, the silicon nitride first material layers 121 are selectively removed via the back side opening 84, thereby forming third back side recesses 66 located between adjacent layers of insulating material 123.

The first material layers 121 may be selectively removed by selective wet etching with a solution of phosphoric acid using of silicon oxide or polysilicon blocking layer portions 4 as an etch stop. With the removal of the first material layers 121, the remaining portions (e.g. 4a, 4b) of the sacrificial blocking layer 44 are exposed in the third back side recesses 66. Then, as illustrated in FIG. 5H, remaining portions 4a, 4b of the sacrificial blocking layer 44 are selectively removed (e.g. with HF), thereby exposing the plurality of separate discrete charge storage segments 9a, 9b in the third back side recesses 66.

Then, as illustrated in FIG. 5I, a blocking dielectric 7 is formed over the sidewall of the discrete charge storage segments 9a, 9b exposed between the insulating material layers 123. In an embodiment, the blocking dielectric 7 is conformally deposited over the insulating material layers 123 via the third back side recesses 66 and the back side opening 84. Next, as illustrated in FIG. 5I, control gate electrodes 3 are formed over the blocking dielectric 7 between the insulating material layers 123 in the third back side recesses 66 via the back side opening (e.g. trench) 84. In an embodiment, the first material comprises silicon nitride, second material comprises silicon oxide or polysilicon and the control gate electrodes comprise tungsten or tungsten with a TiN or WN barrier layer to form the NAND string 180.

In an embodiment, the substrate 100 comprises a silicon substrate 100. The monolithic three dimensional NAND string 180 is located in an array of monolithic three dimensional NAND strings 180 over the silicon substrate 100. The control gate electrodes 3 comprise at least a first control gate electrode 3a located in a first device level and a second control gate electrode 3b located in a second device level located over the major surface of the substrate and below the first device level. At least one memory cell in the first device level of the three dimensional array of NAND strings 180 is located over another memory cell in the second device level of the three dimensional array of NAND strings 180. The silicon substrate 100 contains an integrated circuit comprising a driver circuit for the memory device located thereon. Further, the NAND strings 180 made by any of the following methods may also be located in array of monolithic three dimensional NAND strings 180 over a silicon substrate 100 which contains an integrated circuit comprising a driver circuit for the memory device.

FIGS. 6A-6D illustrate steps in a method of making a NAND string 180 according to another embodiment. In this embodiment, similar to the previous embodiment, a stack 120 of alternating first material layers 121 and second material layers 122 over a major surface 100a of substrate 100 is provided. As in the previous embodiment, the second material is different from the first material. The first material layer 121 may comprise a nitride (such as silicon nitride) and the second material layer 122 may comprise an oxide (such as silicon oxide) or polysilicon. The stack 120 is etched to form at least one front side opening (memory hole) 81 in the stack 120, as shown in FIG. 6A.

As illustrated in FIG. 6B, and in contrast to the previous embodiment, a front side recess 62 is formed between adjacent first material layers 121 by selectively etching the second material layers. A portion of the second material layers 122 is removed via the front side opening 81 prior to depositing the optional sacrificial blocking dielectric layer 44, the charge storage material layer 99, the tunnel dielectric 11 and the semiconductor channel 1 in the front side opening 81 and the front side recesses 62.

Next, as illustrated in FIG. 6C, the sacrificial blocking dielectric layer 44, the charge storage material layer 99, the tunnel dielectric 11 and the semiconductor channel 1 are formed in the front side opening 81. As in the previous embodiment and as illustrated in FIG. 6D, the NAND string is processed as illustrated in FIGS. 5B-5I above. That is, the second material layers 122 are removed through a back side opening 84 in the stack 120 without removing the first material layers 121, thereby forming back side recesses 64. Then, exposed portions of the sacrificial blocking layer 44 in the back side recesses 64 are selectively etched, thereby exposing portions of the charge storage material layer 99. Then, exposed portions of the charge storage material layer 99 is selectively etched using the first material layers 121 as a mask to form a plurality of separate discrete charge storage segments 9.

In an embodiment, the step of forming the semiconductor channel 1 in the front side opening 81 completely fills the front side opening 81 with a semiconductor channel material. In an alternative embodiment, the step of forming the semiconductor channel 1 in the at least one front side opening 81 forms a semiconductor channel material over the sidewall of the at least one front side opening 81 but not in a central part of the at least one front opening 81 such that the semiconductor channel material does not completely fill the at least one front side opening 81. In this embodiment, similar to the NAND string illustrated in FIGS. 1A and 1B, the method further includes forming an insulating fill material 2 in the central part of the at least one front side opening 81 to completely fill the at least one front side opening 81.

Next, the method includes depositing an insulating material 123 in the back side opening 84 and between the first material layers 121 to form alternating layers of insulating material layers 123 and the first material layers 121, as illustrated in the previous embodiment in FIG. 5E. Then, the method includes a step of removing the insulating material 123 from the back side opening 84 and optionally partially removing the insulating material 123 between the first material layers 121 to form recesses 65 between adjacent first material layers 121, as illustrated in the previous embodiment in FIG. 5F.

Then, the first material layers 121 are selectively removed via the back side opening 84, thereby forming back side recesses 66 located between adjacent layers of insulating material 123, thereby exposing the remaining portions (e.g. 4a, 4b) of the sacrificial blocking layer 44 in the back side recesses 66. Next, the remaining portions 4a, 4b of the sacrificial blocking layer 44 are selectively removed, thereby exposing the plurality of separate discrete charge storage segments 9a, 9b in the back side recesses 66.

Then, as illustrated in FIG. 5H of the previous embodiment, a blocking dielectric 7 is formed over the sidewall of the discrete charge storage segments 9a, 9b exposed between the insulating material layers 123. In an embodiment, the blocking dielectric 7 is conformally deposited over the insulating material layers 123 in the back side recesses 66 and the back side opening 84. Next, as illustrated in FIG. 5I of the previous embodiment, control gate electrodes 3 are formed over the blocking dielectric 7 between the insulating material layers 123. The result illustrated in FIG. 6D is a NAND sting 180 with a front side recess 62 between adjacent charge storage segments 9. The front side recesses 62 improve the electrical isolation of adjacent charge storage segments 9 from each other. As illustrated in FIG. 6D, the charge storage elements 9 are located adjacent to both the vertical sidewall of the control gate electrodes 3 and the horizontal sidewalls of the control gate electrodes 3 in the front side recesses 62. In an alternative embodiment, the charge storage elements 9 are only located adjacent the vertical sidewall of the control gate electrodes 3.

In both of these embodiments, the channel 1 and the tunnel dielectric 11 are continuous in the front side opening 81 and are present over the horizontal sidewalls of the control gate electrodes 3 and layers 123 in the front side recesses 62. However, elements 9 are preferably not present over the vertical sidewalls of layers 123 in the front side recesses 62.

Figure 7A:
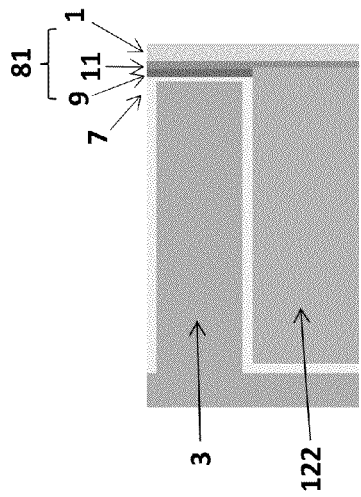
FIGS. 7A and 7B illustrate steps in a method of making a NAND string according to another embodiment.
Figure 7B:
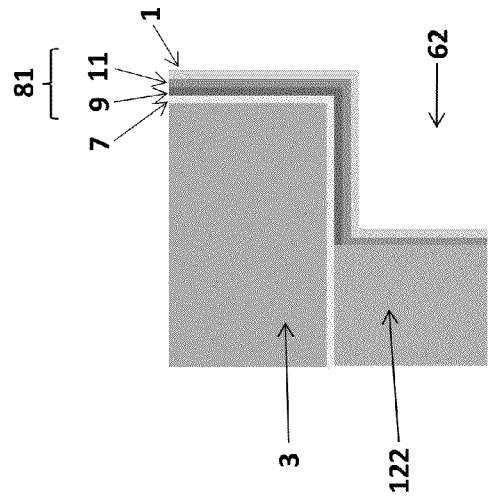

FIGS. 7A and 7B illustrate steps in a method of making a NAND string 180 according to another embodiment. In this embodiment, similar to the previous embodiments, a stack 120 of alternating first material layers 121 and second material layers 122 over a major surface 100a of substrate 100 is provided. The second material is different from the first material. In an embodiment, the first material comprises a nitride and the second material comprises an oxide or polysilicon. As in the previous embodiments, the stack 120 is etched to form at least one front side opening (memory hole) 81 in the stack 120.

In contrast to the previous embodiments, in this embodiment a buffer layer 6 is formed over a sidewall of the at least one opening 81 prior to forming the sacrificial blocking layer 99. The buffer layer 6 may be made of any suitable material, such as polysilicon, which is different from the blocking layer 44, which may comprise $SiO_2$. Next, a sacrificial blocking layer 44 (e.g. a silicon oxide layer) is formed over the buffer layer 6. A charge storage material layer 99 is then formed over the sacrificial blocking layer 44. In an embodiment, the charge storage material layer 99 comprises a charge storage dielectric material. In an alternative embodiment, the charge storage material layer 99 comprises a floating gate material. Then, a tunnel dielectric layer 11 is formed over the charge storage material layer 99 followed by forming a semiconductor channel 1 material over the tunnel dielectric layer 11 in the at least one front side opening 81.

In this embodiment, similar to the previous embodiments, the method includes selectively removing the second material layers 122 through a back side opening 84 in the stack 120 without removing the first material layers 121. This step results in the formation of back side recesses 64 located between adjacent first material layers 121. Additionally, this step results in the buffer layer 6 being exposed in the back side recesses.

Then, the buffer layer 6 is selectively etched using the first material layers 121 as a mask to form a plurality of separate discrete buffer segments and to expose portions of the sacrificial blocking dielectric 44. The exposed portions of the sacrificial blocking dielectric 44 are then selectively removed, such as by selective etching, to expose a sidewall of the discrete charge storage segments 9, as illustrated in FIG. 5D and as described above.

Next, the method includes depositing an insulating material 123 in the back side opening 84 and between the first material layers 121 to form alternating layers of insulating material layers 123 and the first material layers 121, as illustrated in FIG. 5E and discussed above. This method also includes a step of removing the insulating material 123 from the back side opening 84 and optionally partially removing the insulating material 123 between the first material layers 121 to form recesses 65 between adjacent first material layers 121.

Next, as discussed above and illustrated in FIG. 5G, the first material layers 121 are selectively removed via the back side opening 84, thereby forming back side recesses 66 located between adjacent layers of insulating material 123. With the removal of the first material layers 121, the remaining portions of the buffer layer are exposed in the third back side recesses 66. The remaining portions of the buffer layer are selectively removed by TMY or TMAH etching such that the remaining portions (e.g. 4a, 4b) of the sacrificial blocking layer 44 are used as an etch stop and are exposed in the back side recesses 66. Then, as discussed above and illustrated in FIG. 5H, remaining portions 4a, 4b of the sacrificial blocking layer 44 are selectively removed, thereby exposing plurality of separate discrete charge storage segments 9a, 9b in the back side recesses 66.

Then, as illustrated in FIG. 5H discussed above, a blocking dielectric 7 is formed over the sidewall of the discrete charge storage segments 9a, 9b exposed between the insulating material layers 123 and is conformally deposited over the insulating material layers 123 in the back side recesses 66 and the back side opening 84. Next, as illustrated in FIG. 5I and discussed above, control gate electrodes 3 are formed over the blocking dielectric 7 between the insulating material layers 123. The resulting structure is illustrated in FIG. 7B where the buffer layer 6 and the blocking layer 44 are completely removed such that no portions of these layers remain. In an embodiment, the first material comprises silicon nitride, the second material comprises silicon oxide or polysilicon and the control gate electrodes 3 comprise tungsten.

Figure 8A:
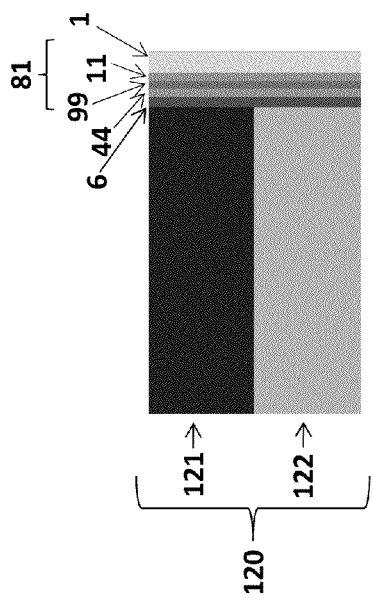
FIGS. 8A and 8B illustrate steps in a method of making a NAND string according to another embodiment.
Figure 8B:
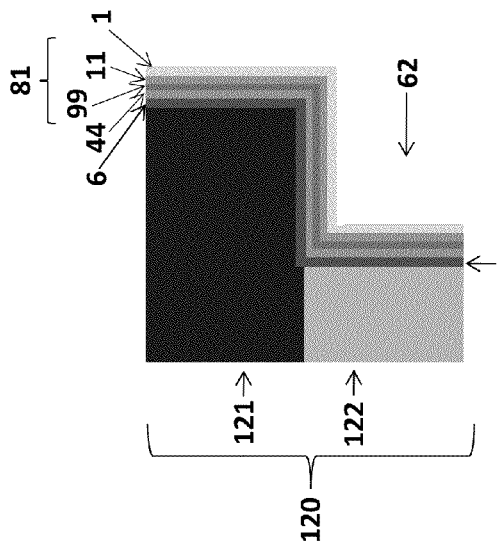

FIGS. 8A and 8B illustrate steps in a method of making a NAND string 180 according to another embodiment. This embodiment includes both the buffer layer 6 of the previous embodiment illustrated in FIGS. 7A and 7B and the front side recesses 62 of the embodiment illustrated in FIGS. 6A-6D. As in the previous embodiments, a stack 120 of alternating first material layers 121 and second material layers 122 over a major surface 100a of substrate 100 is provided. The second material is different from the first material. The stack 120 is etched to form at least one front side opening (memory hole) 81 in the stack 120.

In contrast to the previous embodiment and similar to the embodiment illustrated in FIGS. 6A-6D, a front side recess 62 is formed between adjacent first material layers 121 by selectively etching the second material layers 122 as illustrated in FIG. 6B discussed above. A portion of the second material layers 122 is then removed via the front side opening 81 prior to depositing buffer layer 6, the sacrificial blocking dielectric layer 44, the floating gate layer 99, the tunnel dielectric 11 and the semiconductor channel 1 in the front side opening 81 and the front side recesses 62, as illustrated in FIG. 8A.

The NAND string 180 is formed following the steps illustrated in FIGS. 5A-5I and 6A-6D as discussed above. However, this embodiment includes a step of selectively removing the buffer layer 6 to form a plurality of separate discrete buffer layer segments prior to selectively removing the sacrificial blocking dielectric 44 in the back side recesses 64 during the step shown in FIG. 5C. This method also includes a step of removing the remaining discrete buffer segments prior to selectively removing the remaining portions 4a, 4b of the sacrificial blocking layer 44 in the back side recesses 66 (illustrated in FIG. 5H), to form the NAND string 180 shown in FIG. 8B which is similar to the NAND string shown in FIG. 6D.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of making a monolithic three dimensional NAND string, comprising:

forming a stack of alternating layers of a first material and a second material different from the first material over a substrate;

etching the stack to form at least one opening in the stack;

forming a buffer layer over a sidewall of the at least one opening;

forming a charge storage material layer over the buffer layer;

forming a tunnel dielectric layer over the charge storage material layer in the at least one opening;

forming a semiconductor channel material over the tunnel dielectric layer in the at least one opening;

selectively removing the second material layers without removing the first material layers;

etching the buffer layer using the first material layers as a mask to form a plurality of separate discrete buffer segments and to expose portions of the charge storage material layer;

etching the exposed portions of the charge storage material layer using the first material layers as a mask to form a plurality of separate discrete charge storage segments;

depositing an insulating material between the first material layers to form alternating layers of insulating material layers and the first material layers;

selectively removing the first material layers to expose a sidewall of the discrete buffer segments;

etching the discrete buffer segments to expose a sidewall of the discrete charge storage segments;

forming a blocking dielectric over the sidewall of the discrete charge storage segments exposed between the insulating material layers; and forming control gate electrodes over the blocking dielectric between the insulating material layers.

2. The method of claim 1, further comprising:

forming a sacrificial blocking layer over the buffer layer prior to the step of forming the charge storage material layer; and etching the sacrificial blocking layer using the first material layers as a mask to expose portions of the charge storage material layer between the first material layers.

3. The method of claim 1, wherein the buffer layer comprises polysilicon.

4. The method of claim 1, wherein the charge storage material layer comprises a charge storage dielectric material.

5. The method of claim 1, wherein the charge storage material layer comprises a floating gate material.

6. The method of claim 1, further comprising etching the stack to form a back side trench in the stack;

wherein:

the steps of selectively removing the second material layers, selectively removing the first material layers, forming the blocking dielectric and forming the control gate electrodes occurs through the back side trench; and the step of depositing the insulating material between the first material layers comprises depositing the insulating material between the first material layers through the back side trench and then recessing the insulating material to remove the insulating material from the back side trench while leaving the alternating layers of insulating material layers and the first material layers.

7. The method of claim 1, wherein:

the first material comprises a nitride; and the second material comprises an oxide or polysilicon.

8. The method of claim 7, wherein:

the first material comprises silicon nitride;

the second material comprises silicon oxide or polysilicon; and the control gate electrodes comprise tungsten.

9. The method of claim 1, wherein the step of forming the semiconductor channel layer in the at least one opening completely fills the at least one opening with a semiconductor channel material.

10. The method of claim 1, wherein the step of forming the semiconductor channel layer in the at least one opening forms a semiconductor channel material over the sidewall of the at least one opening but not in a central part of the at least one opening such that the semiconductor channel material does not completely fill the at least one opening and the method further comprises forming an insulating fill material in the central part of the at least one opening to completely fill the at least one opening.

11. The method of claim 1, wherein:

the substrate comprises a silicon substrate;

the monolithic three dimensional NAND string is located in an array of monolithic three dimensional NAND strings over the silicon substrate;

the control gate electrodes comprise at least a first control gate electrode located in a first device level and a second control gate electrode located in a second device level located over a major surface of the silicon substrate and below the first device level;

at least one memory cell in the first device level of the three dimensional array of NAND strings is located over another memory cell in the second device level of the three dimensional array of NAND strings; and the silicon substrate contains an integrated circuit comprising a driver circuit for the memory device located thereon.

12. A method of making a monolithic three dimensional NAND string, comprising:

forming a stack of alternating layers of a first material and a second material different from the first material over a substrate;

etching the stack to form at least one opening in the stack;

selectively removing a portion of the second material layers without removing the first material layers to form first recesses between the first material layers;

forming a charge storage material layer over a sidewall of the at least one opening and over exposed surface of the layers of first material and remaining second material in the first recesses;

forming a tunnel dielectric layer over the charge storage material layer in the at least one opening and in the first recesses;

forming a semiconductor channel material over the tunnel dielectric layer in the at least one opening and in the first recesses;

selectively removing the remaining second material layers without removing the first material layers;

etching the charge storage material layer using the first material layers as a mask to form a plurality of separate discrete charge storage segments;

depositing an insulating material between the first material layers to form alternating layers of insulating material layers and the first material layers;

selectively removing the first material layers to expose a sidewall of the discrete charge storage segments;

forming a blocking dielectric over the sidewall of the discrete charge storage segments exposed between the insulating material layers; and forming control gate electrodes over the blocking dielectric between the insulating material layers.

13. The method of claim 12, further comprising:
forming a buffer layer over the sidewall of the at least one opening and over the exposed surface of the layers of first material and remaining second material in the first recesses prior to the step of forming the charge storage material layer;
etching the buffer layer using the first material layers as a mask to form a plurality of discrete buffer layer segments and to expose of the charge storage material layer between the first material layers; and
etching the discrete buffer segments to expose the discrete charge storage segments after selectively removing the first material layers.

14. The method of claim 12, further comprising:
forming a sacrificial blocking layer over the sidewall of the at least one opening and over the exposed surface of the layers of first material and remaining second material in the first recesses prior to the step of forming the charge storage material layer; and
etching the sacrificial blocking layer using the first material layers as a mask to expose portions of the charge storage material layer between the first material layers.

15. The method of claim 12, wherein the charge storage material layer comprises a charge storage dielectric material.

16. The method of claim 12, wherein the charge storage material layer comprises a floating gate material.

17. The method of claim 12, further comprising etching the stack to form a back side trench in the stack;
wherein:
the steps of selectively removing the second material layers, selectively removing the first material layers, forming the blocking dielectric and forming the control gate electrodes occurs through the back side trench; and
the step of depositing the insulating material between the first material layers comprises depositing the insulating material between the first material layers through the back side trench and then recessing the insulating material to remove the insulating material from the back side trench while leaving the alternating layers of insulating material layers and the first material layers.

18. The method of claim 12, wherein:
the first material comprises a nitride; and
the second material comprises an oxide or polysilicon.

19. The method of claim 18, wherein:
the first material comprises silicon nitride;
the second material comprises silicon oxide or polysilicon; and
the control gate electrodes comprise tungsten.

20. The method of claim 12, wherein the step of forming the semiconductor channel layer in the at least one opening completely fills the at least one opening with a semiconductor channel material.

21. The method of claim 12, wherein the step of forming the semiconductor channel layer in the at least one opening forms a semiconductor channel material over the sidewall of the at least one opening but not in a central part of the at least one opening such that the semiconductor channel material does not completely fill the at least one opening and the method further comprises forming an insulating fill material in the central part of the at least one opening to completely fill the at least one opening.

22. The method of claim 12, wherein:
the substrate comprises a silicon substrate;
the monolithic three dimensional NAND string is located in an array of monolithic three dimensional NAND strings over the silicon substrate;
the control gate electrodes comprise at least a first control gate electrode located in a first device level and a second control gate electrode located in a second device level located over a major surface of the silicon substrate and below the first device level;
at least one memory cell in the first device level of the three dimensional array of NAND strings is located over another memory cell in the second device level of the three dimensional array of NAND strings; and
the silicon substrate contains an integrated circuit comprising a driver circuit for the memory device located thereon.

* * * * *